(12) United States Patent
Ueno et al.

(10) Patent No.: US 10,537,972 B2
(45) Date of Patent: Jan. 21, 2020

(54) POLISHING METHOD AND POLISHING APPARATUS

(71) Applicant: SHIN-ETSU HANDOTAI CO., LTD., Tokyo (JP)

(72) Inventors: Junichi Ueno, Shirakawa (JP); Michito Sato, Nishigo-mura (JP); Kaoru Ishii, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 172 days.

(21) Appl. No.: 15/751,990

(22) PCT Filed: Aug. 16, 2016

(86) PCT No.: PCT/JP2016/003745
§ 371 (c)(1),
(2) Date: Feb. 12, 2018

(87) PCT Pub. No.: WO2017/038032
PCT Pub. Date: Mar. 9, 2017

(65) Prior Publication Data
US 2018/0229344 A1    Aug. 16, 2018

(30) Foreign Application Priority Data

Sep. 3, 2015 (JP) .................................. 2015-173929

(51) Int. Cl.
*B24B 37/015* (2012.01)
*B24B 55/03* (2006.01)
(Continued)

(52) U.S. Cl.
CPC ............ *B24B 37/015* (2013.01); *B24B 7/228* (2013.01); *B24B 27/0076* (2013.01);
(Continued)

(58) Field of Classification Search
CPC ... B24B 7/228; B24B 27/0076; B24B 37/015; B24B 37/042; B24B 49/14; B24B 55/02;
(Continued)

(56) References Cited

U.S. PATENT DOCUMENTS 4,313,284 A * 2/1982 Walsh .................... B24B 37/015
451/288
4,450,652 A * 5/1984 Walsh ...................... B24B 49/14
451/288

(Continued)

FOREIGN PATENT DOCUMENTS

JP    H06-99350 A    4/1994
JP    H9-155732 A    6/1997
(Continued)

OTHER PUBLICATIONS

Oct. 25, 2016 International Search Report issued in International Patent Application No. PCT/JP2016/003745.

*Primary Examiner* — Timothy V Eley
(74) *Attorney, Agent, or Firm* — Oliff PLC

(57) ABSTRACT

A polishing method including rubbing a wafer held by holding means against a polishing pad attached to a turntable while cooling the turntable by supplying a refrigerant to a refrigerant flow path provided in the turntable which is driven to rotate by a motor, thereby performing polishing, the polishing method being characterized in that, during standby after end of the polishing of the wafer and before performing the polishing of a next wafer, a flow volume of the refrigerant is controlled to be less than a flow volume of the refrigerant during the polishing where the wafer is polished, the turntable is rotated by the motor, and a water retaining liquid having a temperature adjusted to a room temperature or more is supplied to the polishing pad.

8 Claims, 4 Drawing Sheets

(51) Int. Cl.
*B24B 37/04* (2012.01)
*B24B 27/00* (2006.01)
*B24B 7/22* (2006.01)
*B24B 9/14* (2006.01)
*H01L 21/304* (2006.01)
*B24B 49/14* (2006.01)
*H01L 21/02* (2006.01)
*H01L 21/67* (2006.01)

(52) U.S. Cl.
CPC ............ *B24B 37/042* (2013.01); *B24B 49/14* (2013.01); *B24B 55/03* (2013.01); *H01L 21/02002* (2013.01); *H01L 21/304* (2013.01); *H01L 21/67219* (2013.01)

(58) Field of Classification Search
CPC . B24B 55/03; H01L 21/02002; H01L 21/304; H01L 21/67219
See application file for complete search history.

(56) References Cited

U.S. PATENT DOCUMENTS

| | | | | |
|---|---|---|---|---|
| 5,700,180 A | * | 12/1997 | Sandhu | B23Q 15/013 451/21 |
| 5,733,177 A | * | 3/1998 | Tsuchiya | B24B 37/042 451/41 |
| 6,102,778 A | | 8/2000 | Morita | |
| 6,121,144 A | * | 9/2000 | Marcyk | B24B 1/00 216/89 |
| 6,299,516 B1 | * | 10/2001 | Tolles | B24B 37/11 451/287 |
| 6,358,119 B1 | * | 3/2002 | Shih | B24B 37/015 451/36 |
| 6,485,359 B1 | * | 11/2002 | Li | B24B 7/228 451/287 |
| 9,005,999 B2 | * | 4/2015 | Xu | H01L 21/302 438/16 |
| 2009/0264052 A1 | | 10/2009 | Torikoshi et al. | |

FOREIGN PATENT DOCUMENTS

| | | |
|---|---|---|
| JP | 2000-202765 A | 7/2000 |
| JP | 2000-301440 A | 10/2000 |
| JP | 2007-075973 A | 3/2007 |
| JP | 2010-205796 A | 9/2010 |

\* cited by examiner

POLISHING METHOD AND POLISHING APPARATUS

TECHNICAL FIELD

The present invention relates to a polishing method and a polishing apparatus for wafers.

BACKGROUND ART

In a polishing apparatus for wafers such as silicon wafers, it is general to stop a turntable or a machining head of a rotary system in a standby state where a wafer is not polished. Further, it is also general to keep a turntable cooling function in the same state as that in polishing even in the standby state, and to intermittently supply a water retaining liquid to a polishing pad to prevent the polishing pad attached to an upper side of the turntable from being dried.

The polishing apparatus for semiconductor wafers is mainly constituted of a polishing stage having a turntable which carries out polishing and a conveying stage which conveys wafers. In the wafer conveying stage, ejection of each wafer from a cassette, storage of the wafer in the cassette, and attachment/detachment of the wafer to/from holding means such as a polishing head are performed. It is to be noted that this series of operations are all completed within a polishing time.

In the polishing stage, a wafer held by the polishing head is brought into contact with the polishing pad while supplying a polishing agent onto the polishing pad attached to the turntable, and the polishing head and the turntable are rotated to perform the polishing. At the time of the polishing, heat is generated due to friction of the polishing pad, the polishing agent, and the wafer, or heat is generated from a motor by rotation of the turntable.

As to the heat generation due to the friction during the polishing, for the purpose of maintaining a temperature of the turntable constant, a refrigerant such as low-temperature cooling water is flowed to a turntable unit to remove the heat (see Patent Literature 1). Further, as to the heat generation from the motor, a motor peripheral portion is cooled by the low-temperature cooling water or forced exhaust is performed at a position where the motor is installed to prevent a turntable temperature from increasing beyond necessity.

In a heat removal operation for such heat generation, a water temperature and a water amount of cooling water or the like and an exhaust amount are adjusted so that an effect can be exerted even in a state where heat generation is considerable at the time of the polishing. Further, in the heat removal operation, the cooling water is constantly supplied to the turntable unit irrespective of the machining state or the standby state, and supply of the cooling water or forced exhaust is also constantly performed in the motor unit.

Thus, in the turntable which is in the standby state where the polishing is not performed, a turntable temperature is lowered approximately 2.17% as compared with that in the polishing. When a next wafer is polished in a state where the turntable temperature is low, a stock removal or a wafer shape differs from that in previous polishing in an early stage of restart of machining. Moreover, in the state where the turntable temperature is low, the stock removal of polishing is reduced or variations in flatness increase. Thus, when the turntable temperature is lowered in the standby state, a warm-up operation based on polishing of a dummy wafer is performed before polishing a subsequent wafer, and thereafter the subsequent wafer is polished.

CITATION LIST

Patent Literature

Japanese Unexamined Patent Application Publication No. Hei 6-99350

DISCLOSURE OF INVENTION

Problem to be Solved by the Invention

As described above, in conventional examples, since a temperature of the turntable in the polishing stage is extremely lowered by the cooling water at the time of the standby, a reduction in stock removal of the polishing or variations of flatness become considerable in the early stage of restart of the machining. Thus, before restarting the polishing from the standby state, the warming-up of the turntable based on dummy polishing is performed, but productivity is lowered by this dummy polishing process.

In view of the problem, it is an object of the present invention to provide a polishing method and a polishing apparatus which suppress a reduction in temperature of a turntable during standby and eliminate a need for warming-up based on dummy polishing before restart of polishing.

Means for Solving Problem

To achieve the object, the present invention provides a polishing method including rubbing a wafer held by holding means against a polishing pad attached to a turntable while cooling the turntable by supplying a refrigerant to a refrigerant flow path provided in the turntable which is driven to rotate by a motor, thereby performing polishing, the polishing method being characterized in that, during standby after end of the polishing of the wafer and before performing the polishing of a next wafer, a flow volume of the refrigerant is controlled to be less than a flow volume of the refrigerant during the polishing where the wafer is polished, the turntable is rotated by the motor, and a water retaining liquid having a temperature adjusted to a room temperature or more is supplied to the polishing pad.

As described above, during the standby, when the flow volume of the refrigerant is reduced and heat is generated from the motor by driving the turntable to rotate and the temperature of the water retaining liquid which is supplied to the polishing pad is increased to a room temperature or more, the turntable is not excessively cooled, and hence an extreme reduction in temperature of the turntable can be avoided.

At this time, it is preferable to set the flow volume of the refrigerant during the standby to ¼ or less of the flow volume of the refrigerant during the polishing.

When the flow volume of the refrigerant during the standby is set to ¼ or less of that during the polishing in this manner, the excessive cooling of the turntable can be more assuredly avoided.

Further, at this time, it is preferable to perform the polishing by using a polishing apparatus which has a plurality of turntables and carries out the polishing on each turntable.

In the polishing apparatus having a plurality of the turntables, a fixed number of turntables often enter the standby state. Thus, in the polishing apparatus having a plurality of the turntables, it is preferable to use the polishing method of the present invention.

Furthermore, to achieve the object, the present invention provides a polishing apparatus including: a turntable which is driven to rotate by a motor and has a refrigerant flow path provided therein; a polishing pad attached to the turntable; and holding means for holding a wafer, the apparatus being configured to rub the wafer held by the holding means against the polishing pad attached to the turntable while cooling the turntable by supplying a refrigerant to the refrigerant flow path, thereby performing polishing, the apparatus including: a flow volume adjusting valve which controls a flow volume of the refrigerant supplied to the refrigerant flow path in the turntable; a turntable control unit which controls rotation of the turntable; and a water retaining liquid supply mechanism which supplies a water retaining liquid to retain water in the polishing pad to the polishing pad during standby after end of the polishing of the wafer and before the polishing of a next wafer, the apparatus being characterized in that the flow volume adjusting valve controls a flow volume of the refrigerant during the standby to be less than a flow volume of the refrigerant during the polishing where the wafer is polished, the turntable control unit rotates the turntable by the motor even during the standby, and the water retaining liquid supply mechanism supplies the water retaining liquid having a temperature adjusted to a room temperature or more to the polishing pad during the standby.

According to such a polishing apparatus, during the standby, when the flow volume of the refrigerant is reduced and heat is generated from the motor by driving the turntable to rotate and the temperature of the water retaining liquid which is supplied to the polishing pad is increased to a room temperature or more, the turntable is not excessively cooled, and hence an extreme reduction in temperature of the turntable can be avoided.

At this time, it is preferable for the flow volume adjusting valve to control the flow volume of the refrigerant during the standby to ¼ or less of the flow volume of the refrigerant during the polishing.

As described above, when the flow regulating valve which sets the flow volume of the refrigerant during the standby to ¼ or less of that during the polishing is provided, excessive cooling of the turntable can be more assuredly avoided.

Moreover, at this time, it is preferable to provide a plurality of the turntables, and to perform the polishing on each turntable.

In the polishing apparatus having a plurality of the turntables, a fixed number of turntables often enter the standby state. Thus, in the polishing apparatus according to the present invention which can suppress a reduction in temperature of the turntables in the standby state is preferably used in particular.

Effect of the Invention

According to the polishing apparatus and the polishing method of the present invention, excessive cooling of the turntable during the standby can be avoided, and a reduction in temperature of the turntable during the standby can be suppressed. Consequently, a warm-up operation based on dummy polishing or the like before restarting the polishing can be omitted, and a reduction in productivity can be suppressed.

BEST MODE(S) FOR CARRYING OUT THE INVENTION

An embodiment of the present invention will now be described hereinafter, but the present invention is not restricted thereto.

As described above, when a temperature of a turntable in a turntable stage is lowered too much by cooling water or the like during standby where polishing is not performed, a stock removal of polishing decreases or variations in flatness increase in the initial stage of restart of the polishing. Thus, warm-up of the turntable based on dummy polishing is performed before restarting the polishing from the standby state, but there is a problem that productivity is degraded by this dummy polishing process.

Thus, the present inventors have repeatedly conducted the earnest examinations to solve such a problem. Consequently, they have discovered that an extreme reduction in temperature of the turntable during the standby can be suppressed by reducing a flow volume of a refrigerant, using heat generation of motor due to rotation of the turntable, and setting a temperature of water retaining liquid in a polishing pad to a room temperature or more, thereby bringing the present invention to completion.

Figure 1:
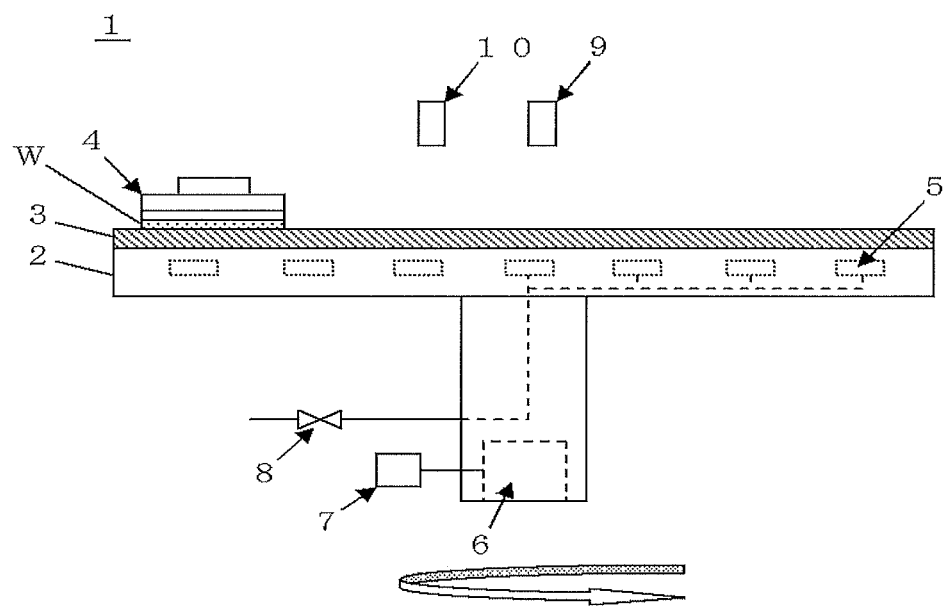
FIG. 1 is a schematic view showing an example of a polishing apparatus according to the present invention.

An example of a polishing apparatus according to the present invention will be first described. As shown in FIG. 1, the polishing apparatus 1 according to the present invention includes a turntable 2 which can be driven to rotate, a polishing pad 3 attached to the turntable 2, and holding means 4 configured to hold a wafer W to be polished.

Additionally, refrigerant flow paths 5 are provided in the turntable 2, and supplying a refrigerant to the refrigerant flow paths 5 enables cooling the turntable 2.

This polishing apparatus 1 is slidably contacted to the wafer W held by the holding means 4 against the polishing pad 3 attached to the turntable 2 while cooling the turntable 2 by supplying the refrigerant to the refrigerant flow paths 5, thereby performing polishing. The polishing apparatus 1 according to the present invention may include a polishing agent supply mechanism 10 which supplies a polishing agent to the polishing pad 3 at the time of this polishing.

Further, the turntable 2 can be driven to rotate by a motor 6, and the rotation of the turntable 2 is controlled by a turntable control unit 7. The turntable control unit 7 can control the rotation of the turntable 2 by, e.g., controlling an output from the motor 6.

In the polishing apparatus 1 according to the present invention, the turntable control unit 7 rotates the turntable 2 by using the motor 6 not only during polishing of the wafer W but also during standby after end of the polishing of the wafer W and before polishing a subsequent wafer W.

Furthermore, a flow volume of the refrigerant which is supplied to the refrigerant flow paths 5 is controlled by a flow volume adjusting valve 8. In the polishing apparatus 1 according to the present invention, the flow volume adjusting valve 8 controls a flow volume of the refrigerant during the standby to be less than a flow volume of the refrigerant during polishing where the wafer W is polished.

More specifically, it is preferable for the flow volume adjusting valve 8 to control the flow volume of the refrigerant during the standby to ¼ or less of the flow volume of the refrigerant during the polishing. When the flow volume adjusting valve 8 controls the flow volume of the refrigerant during the standby to ¼ or less of that during the polishing, excessive cooling of the turntable 2 can be more assuredly prevented.

Moreover, the polishing apparatus 1 according to the present invention includes a water retaining liquid supply mechanism 9 which supplies a water retaining liquid to retain water in the polishing pad 3 to the polishing pad 3 at the time of the standby. In the polishing apparatus 1 according to the present invention, the water retaining liquid supply mechanism 9 supplies the water retaining liquid, whose temperature is adjusted to a room temperature or more, to the polishing pad 3 during the standby.

Such a polishing apparatus 1 according to the present invention uses heat generation from the motor 6 for maintenance of a temperature of the turntable 2 by rotating the turntable 2 during the standby, sets a temperature of the water retaining liquid to a room temperature or more, and reduces a flow volume of the refrigerant, thus avoiding excessive cooling of the turntable 2. Thus, since the turntable 2 in the standby state enters a state where it is subjected to warming-up so that a stock removal or a wafer shape does not greatly change, degradation of quality, e.g., flatness of a wafer in next polishing can be suppressed without performing dummy polishing which can cause degradation of productivity.

A description will now be given as to an example of a polishing method of the present invention when such a polishing apparatus 1 of the present invention as described above is used.

According to the polishing method of the present invention, during the standby after end of the polishing of the wafer W and before performing the polishing of a subsequent wafer W, a flow volume of the refrigerant which cools the turntable 2 is controlled to be less than a flow volume of the refrigerant during the polishing where the wafer W is polished, the turntable 2 is rotated by the motor 6, and the water retaining liquid whose temperature is controlled to a room temperature or more is supplied to the polishing pad 3.

It is preferable to set the flow volume of the refrigerant during the standby to ¼ or less of the flow volume of the refrigerant in the polishing mode. Since the flow volume of the refrigerant which cools the turntable 2 is generally approximately 4.5 L/min during the polishing, the flow volume can be changed to a flow volume of 1.0 L/min or less by the flow volume adjusting valve 8 during the standby. It is preferable for the flow volume of the refrigerant during the standby to be 0.2 L/min or more and 1.0 L/min or less in particular. Adopting this range enables more assuredly preventing excessive cooling of the turntable 2.

Additionally, in the present invention, it is preferable for the rotational speed of the turntable 2 during the standby to be 3 rpm or more and 5 rpm or less. The heat generation from the motor can be sufficiently obtained when the rotational speed of the turntable 2 is 3 rpm or more, and the water retaining liquid can be sufficiently held on the polishing pad when the rotational speed of the turntable 2 is 5 rpm or less.

Further, in the present invention, a temperature of the water retaining liquid supplied to the polishing pad 3 during the standby is adjusted to a room temperature or more, but it is preferable for the temperature of the water retaining liquid to be 23° C. or more and 30° C. or less. When the water retaining liquid is adjusted to this temperature range and supplied to the polishing pad 3, the extreme reduction in temperature of the turntable can be avoided.

Furthermore, the present invention is particularly preferable when a polishing apparatus which has a plurality of turntables and performs polishing on each turntable is used. That is because, in the polishing apparatus having a plurality of the turntables, a fixed number of turntables often enter the standby state.

EXAMPLES

Although the present invention will now be more specifically described hereinafter with reference to examples and comparative examples, the present invention is not restricted to these examples.

Example 1

Each silicon wafer having a diameter of 450 mm was polishing by using the polishing apparatus of the present invention based on the polishing method of the present invention. That is, during standby after end of precedent polishing and before start of next polishing, a flow volume of a refrigerant was controlled to be less than a flow volume of the refrigerant during polishing, a turntable was rotated by a motor, and a water retaining liquid adjusted to a room temperature or more was supplied to a polishing pad. Moreover, dummy polishing was not performed before starting the next polishing.

As the polishing apparatus, a single-side polishing machine (SRED polishing machine manufactured by Fujikoshi Machinery Corp.) having two turntables was used. Additionally, polishing conditions (the rotational speed of each turntable, the rotational speed of a polishing head (holding means), a load, a polishing time, a type of a polishing pad, and a type of a polishing agent) in each polishing stage were determined as shown in the following Table 1. Further, a flow volume of the refrigerant supplied to refrigerant flow paths of each turntable during the polishing was set to 4.5 L/min.

TABLE 1

|  | Rotational speed of turntable (rpm) | Rotational speed of head (rpm) | Head load (g/cm²) | Polishing time (min) | Polishing pad | Polishing agent |
|---|---|---|---|---|---|---|
| Turntable 1 | 31 | 29 | 150 | 3 | Urethane impregnated nonwoven fabric | Colloidal silica-containing alkali solution |
| Turntable 2 | 31 | 29 | 100 | 3 | Suede | Colloidal silica-containing alkali solution |

Further, in each turntable, a flow volume of the refrigerant during the standby was set to 1.0 L/min, the rotational speed of each turntable was set to 5 rpm, and a temperature of the water retaining liquid was set to 25° C. It is to be noted that since a room temperature at this moment was 23° C., the temperature of the water retaining liquid was adjusted to the room temperature or more. Furthermore, the water retaining liquid was intermittently supplied. Moreover, in each turntable, a standby time after end of the polishing and before starting the next polishing was determined as four hours.

Figure 2:
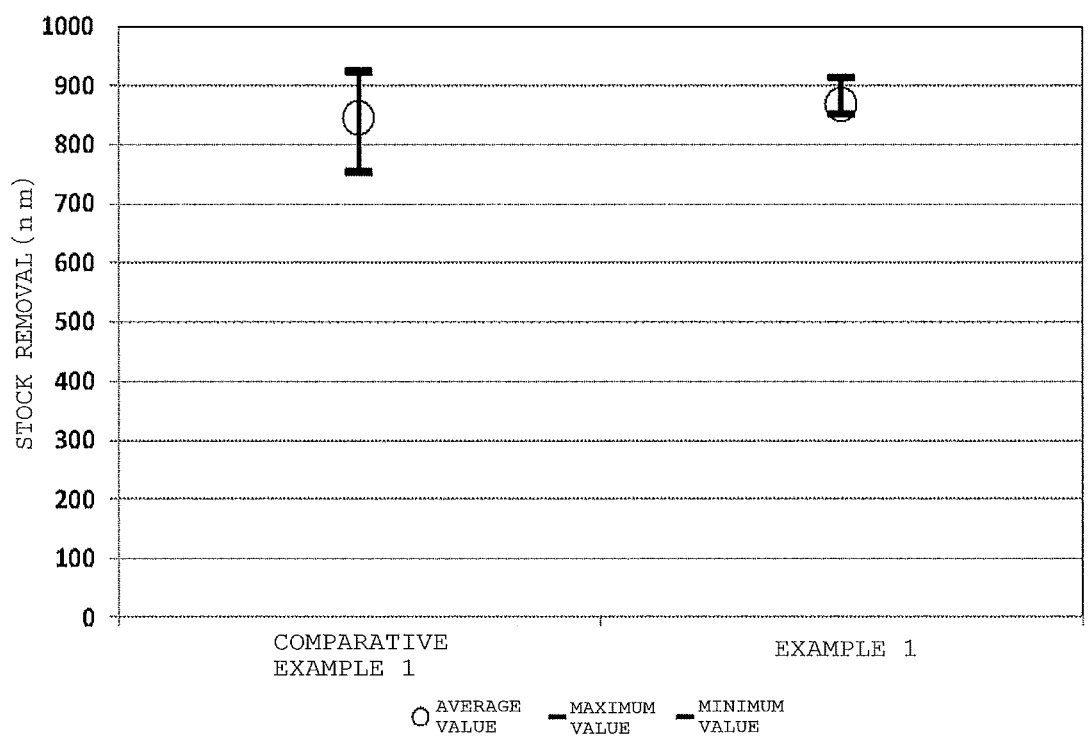
FIG. 2 is a graph showing variations in stock removal of a wafer in each of Example 1 and Comparative Example 1.
Figure 3:
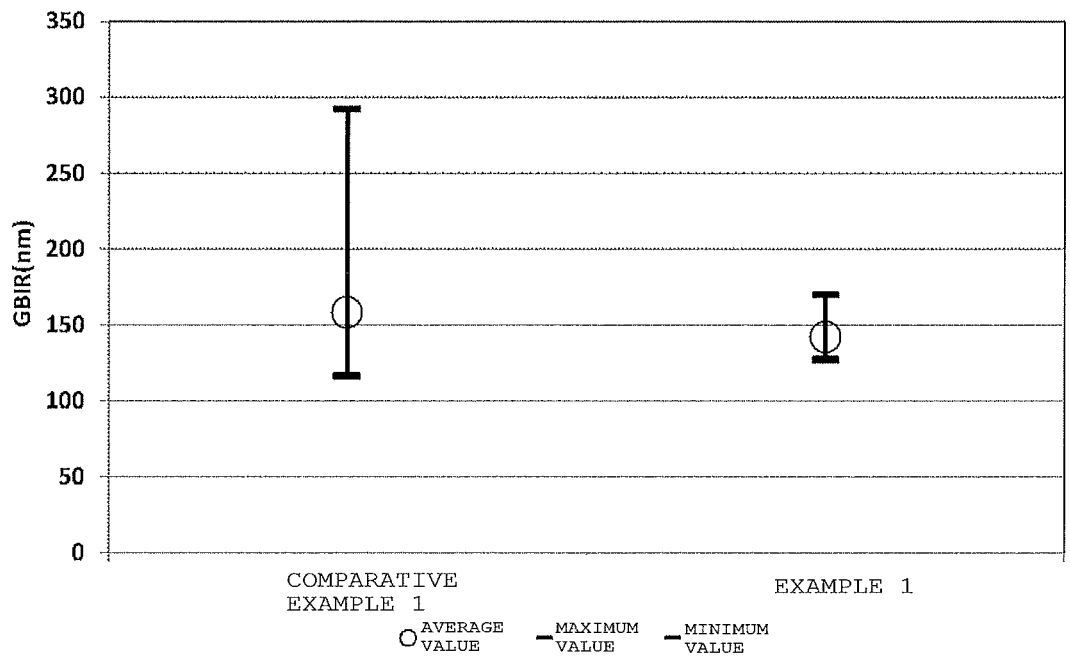
FIG. 3 is a graph showing variations in GBIR of a wafer in each of Example 1 and Comparative Example 1.

Then, stock removals and flatness of 25 wafers polished by the polishing after the standby were measured by Wafer-Sight manufactured by KLA, and variations in stock removal and flatness among respective wafers were evaluated. Table 2, FIG. 2, and FIG. 3 show results.

TABLE 2

|  | Thickness (nm) | | GBIR (nm) | |
|---|---|---|---|---|
|  | Comparative Example 1 | Example 1 | Comparative Example 1 | Example 1 |
| Average value | 843.8 | 867.2 | 157.8 | 141.7 |
| Maximum value | 923 | 913 | 292 | 170 |
| Minimum value | 753 | 851 | 116 | 127 |
| Difference between maximum value and minimum value | 170 | 62 | 176 | 43 |

As can be understood from Table 2 and FIG. 2, in Example 1, a difference between a maximum value and a minimum value of the stock removal was smaller than that in later-described Comparative Example 1. Further, a difference between the maximum value and the minimum value of the stock removal was 170 nm in Comparative Example 1, whereas it was suppressed to approximately ⅓ which is 62 nm in Example 1.

Furthermore, as can be understood from Table 2 and FIG. 3, in Example 1, a difference between a maximum value and a minimum value of GBIR (Global Backsurface-referenced Ideal plane/Range) which is an index of flatness of wafers was smaller than that of the later-described Comparative Example 1. Moreover, the difference between the maximum value and the minimum value of GBIR was 176 nm in Comparative Example 1, whereas it was suppressed to approximately ¼ which is 43 nm in Example 1.

As described above, it was revealed that the present invention can suppress a reduction in turntable temperature during the standby and consequently can suppress variations in wafer quality even if dummy polishing is omitted.

Comparative Example 1

Silicon wafers were polished under the same conditions as those of Example 1 except that a flow volume of a refrigerant during standby was set to be equal to a flow volume of the refrigerant during polishing, a turntable was not rotated, and a water retaining liquid having a temperature adjusted to be less than a room temperature was supplied to a polishing pad. Then, stock removals and flatness of the wafers polished by the polishing after the standby were measured by the same method as that of Example 1, and variations in stock removal and flatness among respective wafers were evaluated.

In each turntable during the standby, the flow volume of the refrigerant was set to 4.5 L/min which is the same as that during the polishing, the rotational speed of the turntable was set to 0 rpm (a stopped state), and a temperature of the water retaining liquid was set to 20° C. (i.e., a temperature lower than 23° C. which is the room temperature).

Consequently, as can be understood from Table 2 and FIGS. 2 and 3, variations in stock removal and flatness of the wafers were larger than those in Example 1. Thus, in case of the polishing method of Comparative Example 1, it was confirmed that dummy polishing during which the turntable is warmed up is required, and that the productivity becomes lower than that of Example 1.

Example 2

Aside from Example 1, silicon wafers were polished under the same conditions as those of Example 1. In this example, changes in temperature of a turntable during the standby were measured, and they were compared with changes in temperature of the turntable during the standby in later-described Comparative Example 2.

Comparative Example 2

Silicon wafers were polished under the same conditions as those of Example 2 except that a turntable was not rotated during the standby. In this example, changes in temperature of the turntable during the standby were measured, and they were compared with changes in temperature of the turntable during the standby in Example 2.

Figure 4:
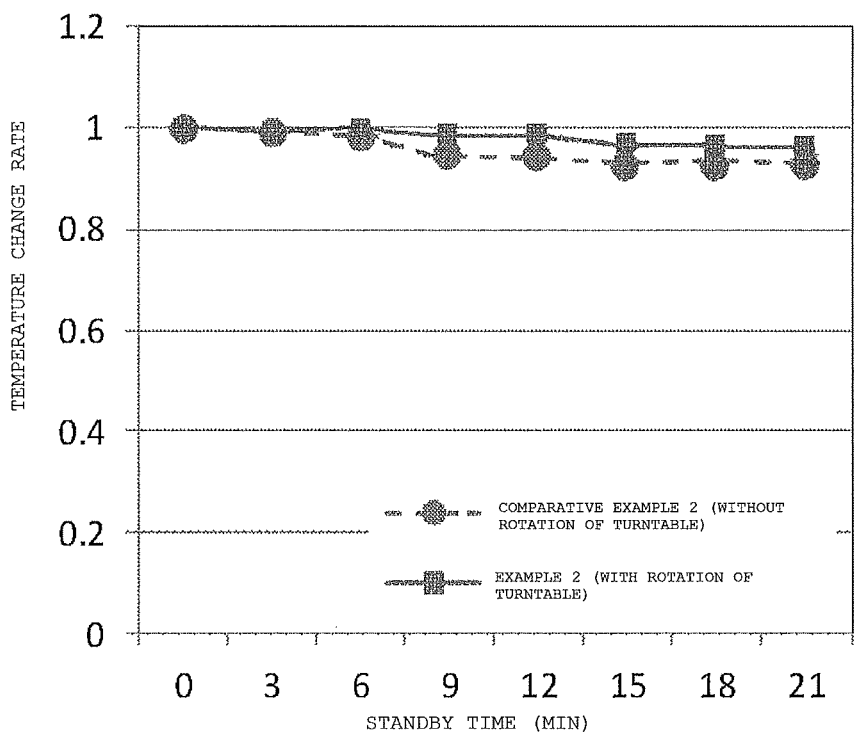
FIG. 4 is a graph showing temperature change rates of a turntable in each of Example 2 and Comparative Example 2.

FIG. 4 shows results. FIG. 4 shows temperature change rates of the turntable during the standby. It is to be noted that the "temperature change rate" shown in FIG. 4 means a relative value of a turntable temperature at each standby time to a turntable temperature when a standby time is 0 minute immediately after polishing, and it can be represented as (the temperature change rate)−(a turntable temperature (° C.) at each standby time)/(a turntable temperature (° C.) when a standby time immediately after polishing is 0 minute). The definition of the "temperature change rate" can be likewise applied to later-described FIGS. 5 and 6. As shown in FIG. 4, it can be understood that a temperature of the turntable is apt to decrease in Comparative Example 2 having no rotation of the turntable during the standby.

Example 3

Aside from Examples 1 and 2, silicon wafers were polished under the same conditions as those of Example 1. In this example, changes in temperature of a turntable during the standby were measured, and they were compared with changes in temperature of the turntable during the standby in later-described Comparative Example 3.

Comparative Example 3

Silicon wafers were polished under the same conditions as those of Example 3 except that a flow volume of a refrigerant during the standby was set to 4.5 L/min which is the same as that during the polishing. In this example, changes in temperature of a turntable during the standby were measured, and they were compared with changes in temperature of the turntable during the standby in Example 3.

Figure 5:
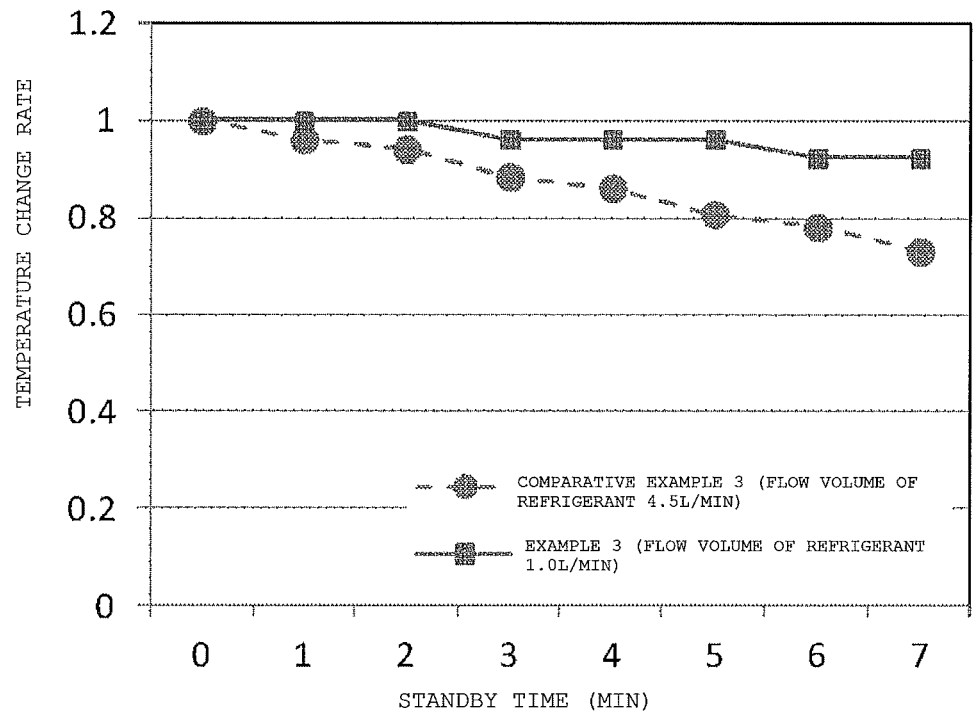
FIG. 5 is a graph showing temperature change rates of a turntable in each of Example 3 and Comparative Example 3.

FIG. 5 shows results. FIG. 5 shows change rates of a turntable temperature during the standby. FIG. 5 has revealed that a temperature reduction in Comparative Example 3 where the flow volume of the refrigerant during the standby was set to the same as that during the polishing is more considerable than that in Example 3.

Example 4

Aside from Examples 1 to 3, silicon wafers were polished under the same conditions as those in Example 1. In this example, changes in temperature of a turntable during the standby were measured, and they were compared with changes in temperature of the turntable during the standby in later-described Comparative Example 4.

Comparative Example 4

Silicon wafers were polished under the same conditions as those of Example 4 except that a temperature of a water retaining liquid during standby was set to 20° C. which is less than a room temperature. In this example, changes in temperature of a turntable during the standby were measured, and compared with changes in temperature of the turntable during standby in Example 4.

Figure 6:
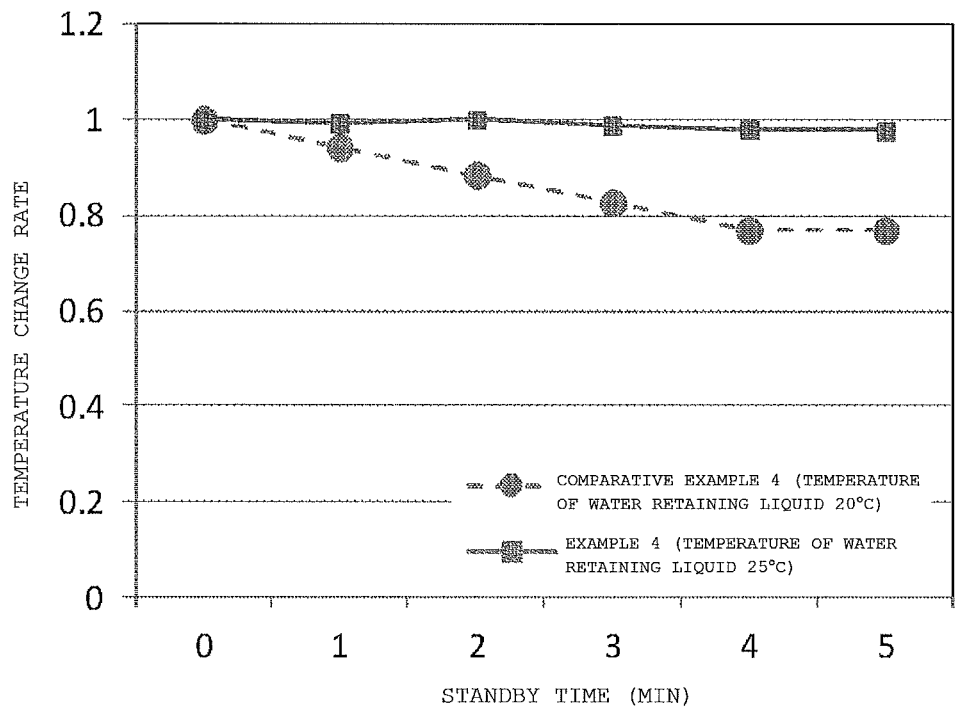
FIG. 6 is a graph showing temperature change rates of a turntable in each of Example 4 and Comparative Example 4.

FIG. 6 shows results. FIG. 6 shows change rates of a turntable temperature during the standby. FIG. 6 has revealed that a temperature reduction in Comparative Example 4 where a temperature of the water retaining liquid during the standby was set to 20° C. which is less than a room temperature is more considerable than that in Example 4.

Example 5

In a polishing apparatus according to the present invention, after end of the polishing of silicon wafers, a turntable was set in the standby mode, and changes in temperature of the turntable during the standby were measured. A flow volume of a refrigerant during the standby was set to 1.0 L/min, the rotational speed of the turntable was set to 5 rpm, and a temperature of a water retaining liquid was set to 25° C. It is to be noted that a flow volume of the refrigerant during the polishing was 4.5 L/min and a room temperature was 23° C.

Comparative Example 5

In each turntable during the standby, after end of the polishing of silicon wafers, a turntable was set in the standby mode, and changes in temperature of the turntable during the standby were measured like Example 2 except that a flow volume of a refrigerant was set to 4.5 L/min which is the same as that during the polishing, the rotational speed of the turntable was set to 0 rpm (a stopped state), and a temperature of a water retaining liquid was set to 20° C. (i.e., a temperature lower than 23° C. which is a room temperature).

Figure 7:
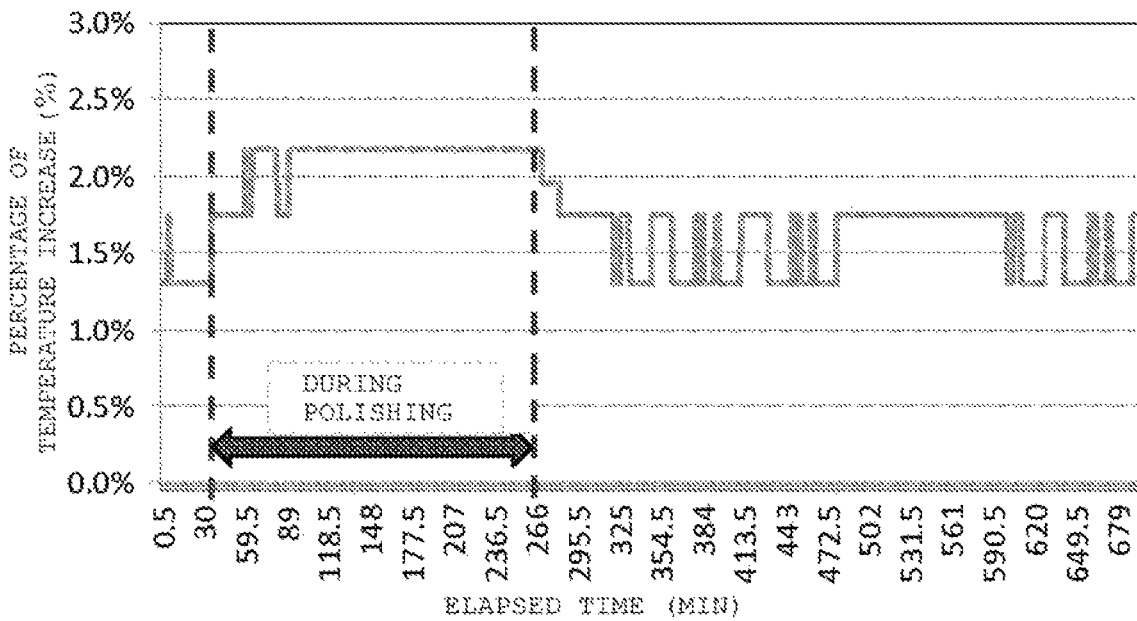
FIG. 7 is a graph showing changes in temperature of a turntable in Example 5.
Figure 8:
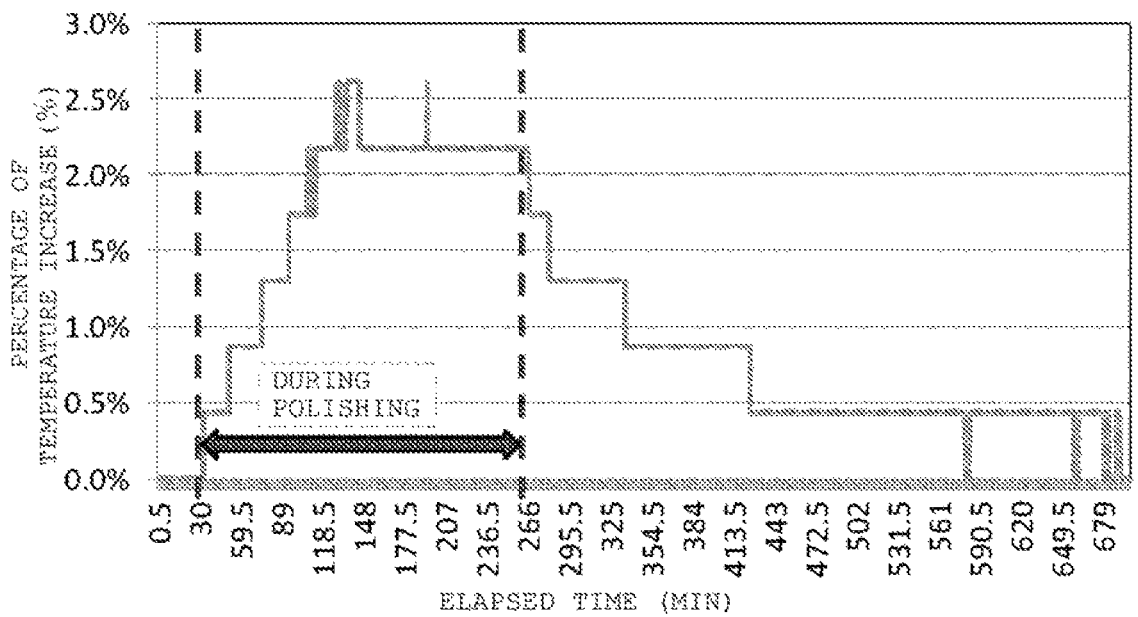
FIG. 8 is a graph showing changes in temperature of a turntable in Comparative Example 5.

FIG. 7 and FIG. 8 show the changes in temperature of the turntable in each of Example 5 and Comparative Example 5. It is to be noted that "percentage of temperature increase" in FIGS. 7 and 8 is defined as a percentage of an increase in turntable temperature during an apparatus shutdown period in which both the polishing and the standby are not performed to a turntable set temperature, and represented as (percentage of temperature increase)=[(turntable temperature (° C.) during measurement)/(turntable set temperature (° C.))]×100. A turntable cooling water is supplied and controlled to a set temperature even during the apparatus shutdown period in which both the polishing and the standby are not performed. As shown in FIG. 7, in Example 5, it was possible to suppress the changes in temperature of the turntable during the standby to approximately 0.73%. On the other hand, in Comparative Example 5, changes in temperature of the turntable during the standby were approximately 2.17%, they are approximately triple counterparts in Example 5.

It is to be noted that the present invention is not restricted to the embodiment. The embodiment is an illustrative example, and any example which has substantially the same structure and exerts the same functions and effects as the technical concept described claims of the present invention is included in the technical scope of the present invention.

The invention claimed is:

1. A method for polishing comprising rubbing a wafer held by holding means against a polishing pad attached to a turntable while cooling the turntable by supplying a refrigerant to a refrigerant flow path provided in the turntable which is driven to rotate by a motor, thereby performing polishing of the wafer,
    wherein, during standby after end of the polishing of the wafer and before performing the polishing of a next wafer,
    a flow volume of the refrigerant is controlled to be less than a flow volume of the refrigerant during the polishing where the wafer is polished, the turntable is rotated by the motor, and a water retaining liquid having a temperature adjusted to a room temperature or more is supplied to the polishing pad.

2. The method for polishing according to claim 1, wherein the flow volume of the refrigerant during the standby is set to ¼ or less of the flow volume of the refrigerant during the polishing.

3. The method for polishing according to claim 2, wherein the polishing is performed by using a polishing apparatus which has a plurality of turntables and carries out the polishing on each turntable.

4. The method for polishing according to claim 1, wherein the polishing is performed by using a polishing apparatus which has a plurality of turntables and carries out the polishing on each turntable.

5. A polishing apparatus comprising: a turntable which is driven to rotate by a motor and has a refrigerant flow path provided therein; a polishing pad attached to the turntable; and holding means for holding a wafer, the apparatus being configured to rub the wafer held by the holding means against the polishing pad attached to the turntable while cooling the turntable by supplying a refrigerant to the refrigerant flow path, thereby performing polishing of the wafer, wherein the apparatus comprises:
a flow volume adjusting valve which controls a flow volume of the refrigerant supplied to the refrigerant flow path in the turntable;
a turntable control unit which controls rotation of the turntable; and
a water retaining liquid supply mechanism which supplies a water retaining liquid to retain water in the polishing pad to the polishing pad during standby after end of the polishing of the wafer and before the polishing of a next wafer, the flow volume adjusting valve controls a flow volume of the refrigerant during the standby to be less than a flow volume of the refrigerant during the polishing where the wafer is polished, the turntable control unit rotates the turntable by the motor even during the standby, and the water retaining liquid supply mechanism supplies the water retaining liquid having a temperature adjusted to a room temperature or more to the polishing pad during the standby.

6. The polishing apparatus according to claim 5, wherein the flow volume adjusting valve controls the flow volume of the refrigerant during the standby to ¼ or less of the flow volume of the refrigerant during the polishing.

7. The polishing apparatus according to claim 6, wherein a plurality of the turntables are provided, and the polishing is performed on each turntable.

8. The polishing apparatus according to claim 5, wherein a plurality of the turntables are provided, and the polishing is performed on each turntable.

\* \* \* \* \*